US009913410B2

(12) United States Patent
Ambriz

(10) Patent No.: US 9,913,410 B2
(45) Date of Patent: *Mar. 6, 2018

(54) EXHAUST AIR DUCTING SYSTEM

(71) Applicant: LEVEL 3 COMMUNICATIONS, LLC, Broomfield, CO (US)

(72) Inventor: Robert Ambriz, Firestone, CO (US)

(73) Assignee: Level 3 Communications, LLC, Broomfield, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/456,342

(22) Filed: Mar. 10, 2017

(65) Prior Publication Data

US 2017/0188487 A1 Jun. 29, 2017

Related U.S. Application Data

(63) Continuation of application No. 14/658,912, filed on Mar. 16, 2015, now Pat. No. 9,596,790.

(60) Provisional application No. 61/953,345, filed on Mar. 14, 2014.

(51) Int. Cl.
*H05K 7/20* (2006.01)

(52) U.S. Cl.
CPC ..... *H05K 7/20836* (2013.01); *H05K 7/20145* (2013.01); *H05K 7/20181* (2013.01); *H05K 7/20736* (2013.01); *H05K 7/20745* (2013.01)

(58) Field of Classification Search
CPC .......... H05K 7/20145; H05K 7/20181; H05K 7/20554; H05K 7/20572–7/2059; H05K 7/20718; H05K 7/20736–7/20745; H04Q 1/035
See application file for complete search history.

(56) References Cited

U.S. PATENT DOCUMENTS

| | | | |
|---|---|---|---|
| 3,192,306 A | 6/1965 | Skonnord | |
| 6,412,292 B2 | 7/2002 | Spinazzola | |
| 6,494,050 B2 | 12/2002 | Spinazzola | |
| 6,557,357 B2 | 5/2003 | Spinazzola | |
| 6,574,970 B2 | 6/2003 | Spinazzola | |
| 6,700,779 B2 | 3/2004 | Hanson et al. | |
| 6,722,151 B2 | 4/2004 | Spinazzola | |
| 6,745,579 B2 | 6/2004 | Spinazzola | |
| 6,791,836 B2 * | 9/2004 | Cipolla | G06F 9/52 165/80.3 |
| 7,286,345 B2 | 10/2007 | Casebolt | |
| 7,372,695 B2 * | 5/2008 | Coglitore | G06F 1/20 361/679.48 |
| 7,486,511 B1 | 2/2009 | Griffel | |
| 7,499,273 B2 * | 3/2009 | Casebolt | G06F 1/20 361/679.46 |
| 7,500,911 B2 | 3/2009 | Johnson | |
| 7,542,287 B2 | 6/2009 | Lewis, II | |
| 7,595,985 B2 | 9/2009 | Adducci | |

(Continued)

*Primary Examiner* — Robert J Hoffberg

(57) ABSTRACT

A system of thermally managing network equipment including a rack housing a network equipment element, an intake coupling including one or more vanes and an exhaust port, a duct, and a rack coupling mechanism configured to adjustably position the intake coupling relative to the rack. The intake coupling is configured to: receive an airflow from the hot air exhaust vent at a first direction; deflect the airflow in a second direction via the one or more vanes; and exhaust the airflow through an opening in the exhaust port.

7 Claims, 11 Drawing Sheets

(56) References Cited

U.S. PATENT DOCUMENTS

| | | | |
|---|---|---|---|
| 7,643,291 B2 | 1/2010 | Mallia | |
| 7,751,188 B1 | 7/2010 | French | |
| 7,752,858 B2 | 7/2010 | Johnson | |
| 7,855,885 B2 | 12/2010 | Adducci | |
| 7,862,410 B2 | 1/2011 | McMahan | |
| 7,872,865 B2* | 1/2011 | Matsushima | G11B 33/142 165/104.33 |
| 7,903,407 B2 | 3/2011 | Matsushima | |
| 8,035,965 B2 | 10/2011 | Adducci | |
| 8,144,464 B2 | 3/2012 | VanDerVeen | |
| 8,154,870 B1* | 4/2012 | Czamara | H05K 7/20736 361/694 |
| 8,210,914 B2 | 7/2012 | McMahan | |
| 8,300,410 B2 | 10/2012 | Slessman | |
| 8,322,155 B2 | 12/2012 | Tutunoglu | |
| 8,327,656 B2 | 12/2012 | Tutunoglu | |
| 8,355,246 B2 | 1/2013 | Linhares | |
| 8,434,804 B2 | 5/2013 | Slessman | |
| 8,544,289 B2 | 10/2013 | Johnson | |
| 8,591,300 B2 | 11/2013 | Slessman | |
| 8,730,671 B2 | 6/2014 | VanDerVeen | |
| 8,783,336 B2 | 7/2014 | Slessman | |
| 8,848,367 B2* | 9/2014 | Adducci | H05K 7/20572 361/694 |
| 8,888,158 B2 | 11/2014 | Slessman | |
| 9,137,930 B2 | 9/2015 | Alshinnawi | |
| 9,237,672 B2 | 1/2016 | Slessman | |
| 9,442,541 B2 | 9/2016 | Pofahl | |
| 9,596,790 B2* | 3/2017 | Ambriz | H05K 7/20145 |
| 2005/0237716 A1 | 10/2005 | Chu | |
| 2005/0280986 A1 | 12/2005 | Coglitore et al. | |
| 2010/0141105 A1 | 6/2010 | Slessman | |
| 2014/0153183 A1 | 6/2014 | Pofahl et al. | |
| 2014/0216683 A1 | 8/2014 | Meyer | |
| 2014/0238639 A1 | 8/2014 | Ambriz et al. | |
| 2015/0264836 A1 | 9/2015 | Ambriz | |
| 2016/0381837 A1 | 12/2016 | Pofahl et al. | |

\* cited by examiner

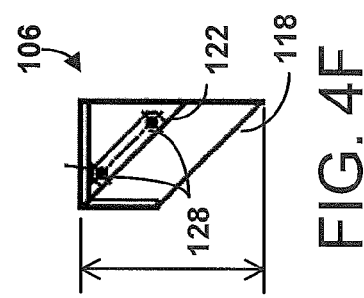
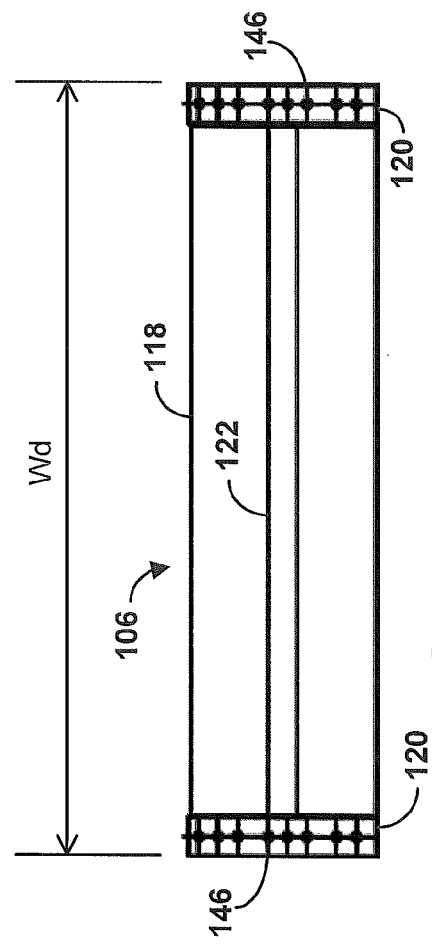
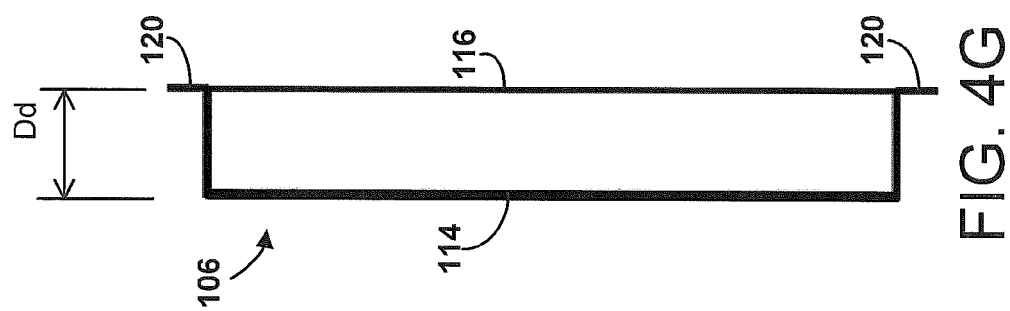

EXHAUST AIR DUCTING SYSTEM

CROSS-REFERENCE TO RELATED APPLICATIONS

This application is a continuation of and claims the benefit of priority to U.S. patent application Ser. No. 14/658,912 entitled "EXHAUST AIR DUCTING SYSTEM," filed Mar. 16, 2015, the entire contents of which are fully incorporated by reference herein for all purposes. Application Ser. No. 14/658,912 claims priority under 35 U.S.C. § 119 from U.S. Provisional Patent Application No. 61/953,345 entitled "EXHAUST AIR DUCTING SYSTEM," filed on Mar. 14, 2014, the entire contents of which are fully incorporated by reference herein for all purposes.

TECHNICAL FIELD

Aspects of the present disclosure involve network equipment elements, and more particularly, involve thermal management of exhaust air from the network equipment elements.

BACKGROUND

Data centers and gateway facilities consume large amounts of energy, not only from the various computer, telecommunications, and storage systems in the facilities, but also from the respective cooling systems needed to manage the heat generated by the equipment. With continuing expansion of computing networks, rising energy costs, and a desire to operate sustainable facilities, the need to efficiently manage energy consumption in data centers and gateway facilities becomes increasingly important. While facility operators may have limited control over the energy consumed by each piece of equipment, operators may control the manner in which the equipment is thermally managed.

Generally speaking, a data center is typically a dedicated building or room that contains servers and storage equipment that run software applications that process and store content and data. A gateway facility, on the other hand, is also typically a dedicated building or room with telecommunication equipment that process and route various forms of communication (e.g., phone calls, web browsing, streaming video) through a vast network of interconnected nodes, networks, and users. While data centers and gateways may perform different functions, both facilities use similar, and often the same, equipment (e.g., servers, routers, switches, server appliances, storage libraries) and face the same thermal management challenges.

In order to keep the equipment running optimally, the layout of data centers and gateway facilities are designed in conjunction with the heating, ventilation, and air-conditioning (HVAC) systems or, more particular to this type of environment, the computer room air-conditioning (CRAC) system. Because most equipment is mounted in standardized racks, and the equipment is designed to intake cool air in the front of the unit and exhaust hot air in the back of the unit, the CRAC system is designed to flow cool air to the front of the equipment racks and to pull hot air from back of the racks for recirculation into the CRAC system.

Often, equipment racks in a data center or gateway facility are arranged in a "hot and cold" aisle arrangement. Referring to FIG. 1, equipment racks 50 are aligned in sets of two rows such that the back 52 of the equipment racks face each other and the front 54 of the racks face outward. In this arrangement, the "hot" aisle is the space formed between the backs of the racks of equipment and the cold aisles are located at the fronts of the racks. Alternatively and referring to FIG. 2, the equipment racks 50 may be aligned in a single row, with the front 54 of the racks in close proximity to the flow of cool air 56. Unfortunately, however, equipment is often installed backwards, intaking warm air and exhausting even warmer air into cool aisles. Such equipment is often very difficult to reorient for a variety of reasons. Nonetheless, in each of these arrangements, the exhaust air 58 must be recirculated back to the CRAC 60 to continue the cooling cycle. In addition to arranging "hot and cold" aisles, operators occasionally employ devices to direct and/or deflect the generated or exhausted warm air away from the equipment (e.g., in an upwards direction due to the natural flow of heated air). While not containing the hot and cold air spaces, these arrangements generally localize the hot and cold air by concentrating cold air at the front of the racks and hot air at the back of the racks.

With these thoughts in mind, among others, aspects of the exhaust air duct system disclosed herein were conceived.

SUMMARY

Aspects of the present disclosure involve an apparatus for thermally managing network equipment. The apparatus is configured to work with and connect to a rack and includes an intake coupling, a duct, and a rack coupling mechanism. In certain instances, the rack may house a network equipment element including a hot air exhaust vent. The intake coupling may include one or more vanes and an exhaust port. The intake coupling may be positioned adjacent the hot air exhaust vent of the network equipment element and may be configured to: receive an airflow from the hot air exhaust vent at a first direction; deflect the airflow in a second direction via the one or more vanes; and exhaust the airflow through an opening in the exhaust port. The duct may include a first end, a second end, and an airflow passage extending between the first end and the second end. The first end may be coupled to the exhaust port of the intake coupling and the second end may be positioned above the network equipment element. The airflow passage may be configured to direct the airflow from the first end to the second end. The rack coupling mechanism may be operably coupled to the rack and configured to adjustably position the intake coupling relative to the rack.

Aspects of the present disclosure may also involve a computing system including a plurality of network equipment elements, a rack housing the plurality of network equipment elements, an intake coupling, and a duct. In certain instances, the intake coupling may be adapted to receive an airflow from at least one network equipment element at a first direction and deflect the airflow in a second direction. The intake coupling may be adapted to secure to the rack in a plurality of positions relative to the hot air exhaust vent of the one network equipment element using a rack coupling mechanism that is configured to position the intake coupling in the plurality of positions by adjusting a lateral distance between the hot air exhaust vent from intake coupling. The duct may be coupled to the intake coupling and adapted to receive the airflow and direct the airflow from the intake coupling to another location.

BRIEF DESCRIPTION OF THE DRAWINGS

Example embodiments are illustrated in referenced figures of the drawings. It is intended that the embodiments and figures disclosed herein are to be considered illustrative rather than limiting.

FIGS. 4C-4G depict the air deflector assembly of the exhaust air duct system of FIG. 4A;

DETAILED DESCRIPTION

Aspects of the present disclosure involve an exhaust air ducting system for thermally managing exhausted air from network equipment in data centers and gateway facilities (collectively referred to as a "data center"). The duct system may be readily adapted to differing types of network equipment and to differing arrangements of the network equipment in the data center. For example, the ducting system may accommodate network equipment elements (e.g., servers, switches, data storage) of various heights, or increments of "rack units" (e.g., 1U, 3U). Additionally, the duct system may accommodate arrangements of the network equipment in hot and cold aisle arrangements, among others.

More particularly, aspects of the present disclosure involve a device for receiving exhaust air from a network equipment element that is housed within a computer rack, and routing the exhausted air to a space where it can effectively be recirculated through the CRAC system. Further, the device can be adjustably mounted to the rack or the network equipment, and the device can be stacked in order to accommodate a rack with multiple network equipment elements housed within the rack.

Figure 1:
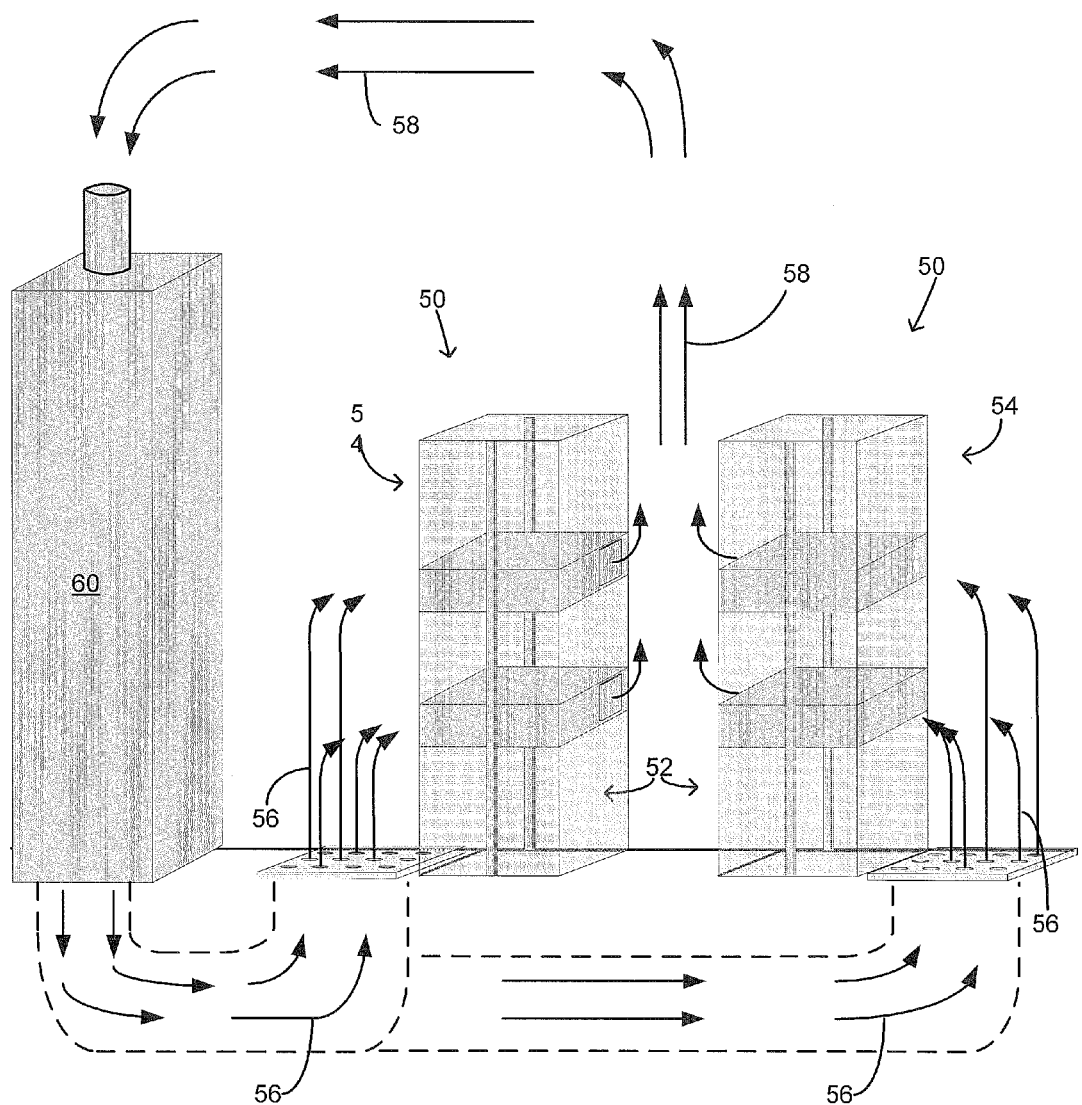
FIG. 1 (prior art) is a side view of a conventional "hot and cold" aisle arrangement with two rows of equipment racks.
Figure 2:
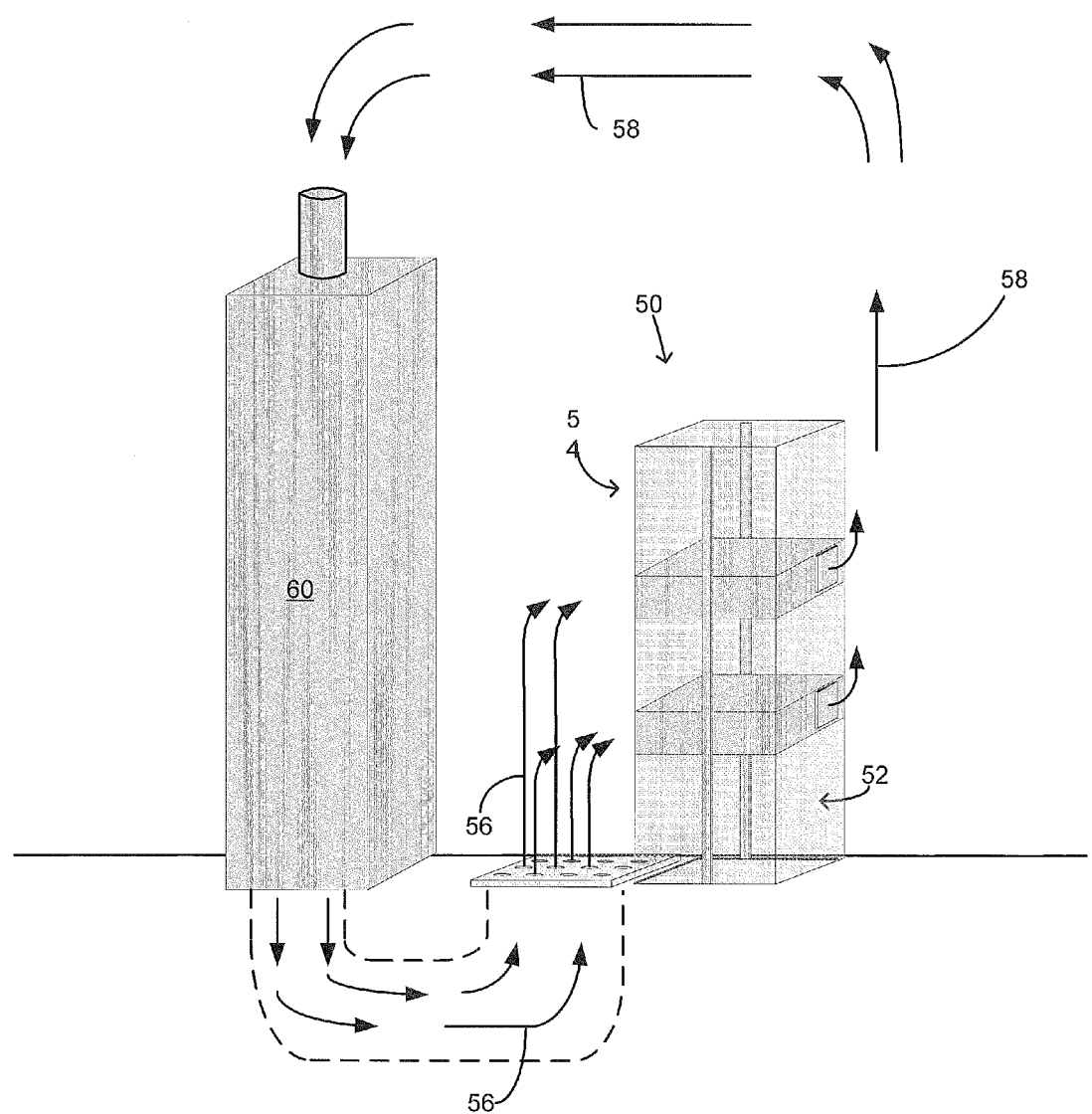
FIG. 2 (prior art) is a side view of a conventional "hot and cold" aisle arrangement with one row of equipment racks.
Figure 3:
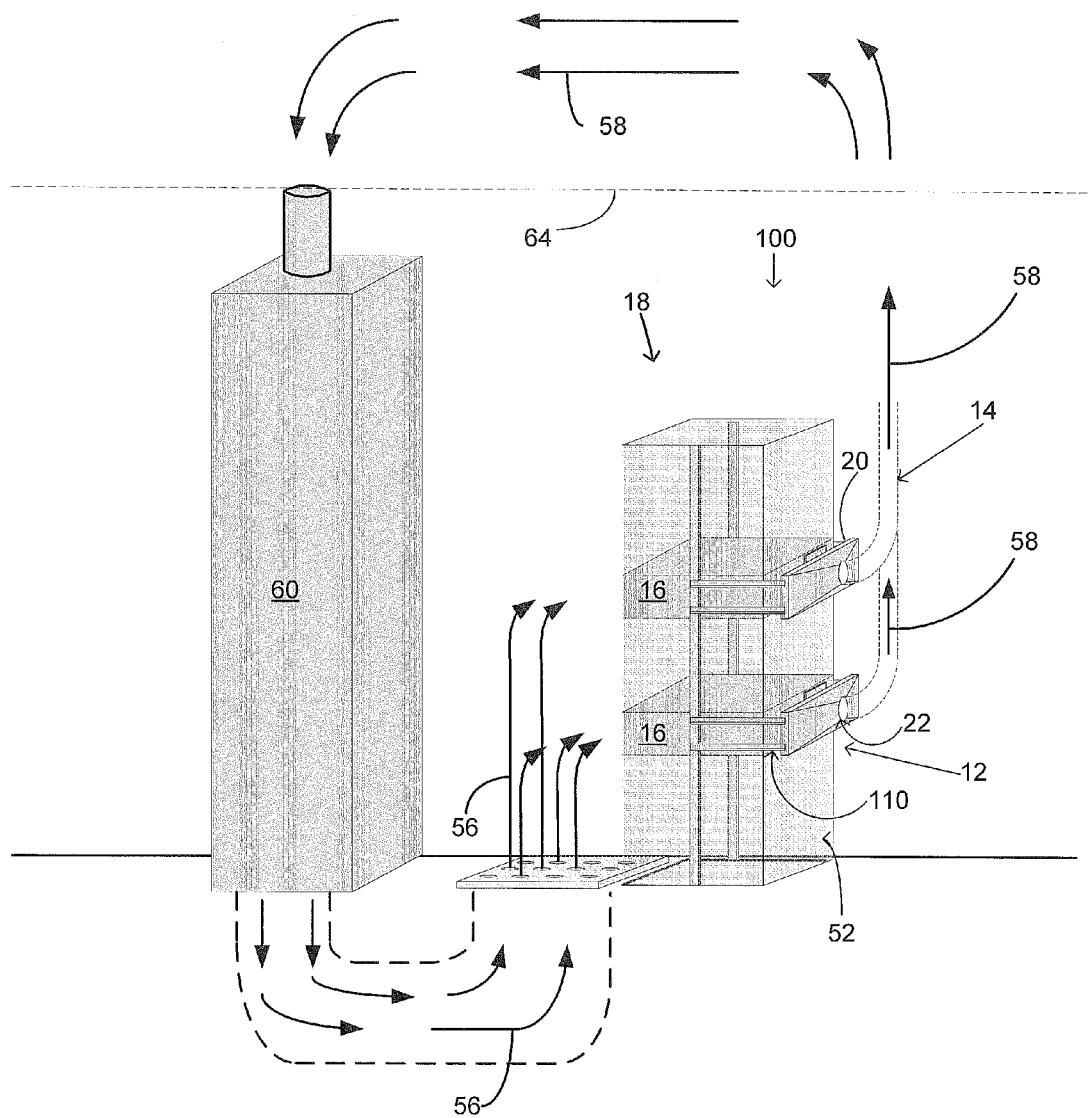
FIG. 3 depicts an exhaust air duct system with the rack hidden for clarity.

The ducting system 10, as depicted in FIG. 3, may include an intake coupling 12 and a duct 14. The intake coupling 12 is positioned adjacent a back portion of a network equipment element 16 to receive hot air exhaust from the network equipment element 16 housed within a computing rack 18. Generally, the back portion 62 of the network equipment element 16 will be located at a back side of the computing rack 18, but occasionally the network equipment element 16 will be positioned such that the back portion 62 of the equipment 16 is positioned at a front side of the rack 18. Thus, the exhaust air duct system 10 can thermally manage the exhausting air from either the front side and/or the backside of the rack 18. Referring again to FIG. 3, the intake coupling 12 may include a shape that generally matches the back portion of the network equipment element 16 or generally matches an exhausting portion (e.g., fan) of the back portion of the equipment element 16. In the embodiment of FIG. 3, the shape of the intake coupling 12 is rectangular 20 at a side positioned to be adjacent the back of the equipment 16 where hot air is exhausted. The shape of the intake coupling 12 then transitions or funnels to a circular opening 22 where it is coupled with the duct 14. The funneling creates a nozzling effect of increasing the velocity of the air from the relatively larger rectangular opening 20 to the relatively smaller circular opening 22. The intake coupling 12 may be formed or cut from a rigid material, such as sheets of aluminum or galvanized steel, among other materials. Alternatively, the intake coupling 12 may be a molded polymer.

Turning to the duct 14 and still referring to FIG. 3, the duct 14 may be circular, flexible, and/or adjustable. For example, the duct 14 may be an expandable plastic or aluminum duct, similar to a return air duct or dryer duct. The duct 14 may be coupled to the intake coupling 12 by any means, including sliding an end portion of the duct 14 over an outwardly extending portion (e.g., flange) of the intake coupling 12 (annular flange). The outwardly extending portion may be a smaller diameter than a diameter of the duct 14. The intake coupling may be secured to the duct 14 by tightening a wire tie, zip tie, or hose clamp, among others, around the overlapping portion of the duct 14 and the intake coupling 12. The duct 14 may be routed up the rack 18 of network equipment elements 16 to terminate in the airspace above the rack 18 (e.g., about 7 feet from ground) or in a plenum ceiling 64, among other places. The duct 14 may be first routed to a side of the rack 18 and then up the rack 18 in order to leave the backside of the rack 18 unobstructed. The duct 14 may be routed to the rack 18 in any number of ways, including securing the duct 14 to the rack 18 with wire ties or zip ties, among others. In certain embodiments, the duct may extend about four inches to about six inches from the back of the equipment 16 and bend upward with a turning radius of about 1.5 to about 2 times a diameter of the duct 14. In this way, the exhaust air 58 from the back portion 62 of the equipment 16 may intermix with ambient air that is caused to flow into the coupling element 12 via the gap formed between the back portion 62 of the equipment 16 and the coupling element 12.

Still referring to FIG. 3, the intake coupling 12 may be secured to the rack 18 via a rack coupling mechanism 110 such that the outer most point of the intake coupling 12 is positioned a desired distance away from the equipment within the rack 18. As will be described with respect to other embodiments, such as FIGS. 4A-4B and 5-7, the rack coupling mechanism 110 may comprise two pair of elongate bolts 130 onto which nuts 132 may be screwed for securing an exhaust air deflector 106 to the network equipment element 16 or, as shown, the rack 18 that houses the equipment 16. The elongate bolts, being connected to the rack, accommodate equipment of different sizes and properly position the intake relative to such equipment. In certain embodiments, the intake coupling 12 may be positioned with a gap of about 1 inch between the intake coupling 12 and the network equipment element 16. The gap allows for air to bypass or flow around the system 100 if, for example, the system 100 experiences backpressure.

While FIG. 3 depicts the intake coupling 12 as shaped to fit a certain size of the back portion of the network equipment element 16 within the rack 18, the intake coupling 12 may be other sizes in order to fit the back portion 62 or exhausting portion of the equipment element 16. For example, the height and width of the rectangular portion of the intake coupling 12 may be various heights and widths to fit particular network equipment element 16 with a range of rack unit sizes (e.g., 1U, 3U, 5U). In such a case, the duct 14 may remain the same, but the size of the intake coupling 12 may be chosen based on the side of the back portion 62 or exhausting portion of the network equipment element 16. Alternatively, the intake coupling 12 may include an altogether different shape. For example, the intake coupling 12 may include a circular shaped opening at the outer most point that transitions or funnels to the circular opening 22.

While the system 100 in FIG. 3 depicts two intake couplings 12 and two ducts 14, the system 100 can be scaled to fit any number of network equipment elements 16 within a rack 18. For example, the system 100 can be adapted to a single network equipment element 16, such as a stand-alone unit, or the system can be adapted to thermally managing five or more network equipment elements 16. In each of these cases, the system 100 can include a number of intake couplings 12 and ducts 14 that match the number of network equipment elements 16.

Turning to other embodiments of the exhaust air ducting system, FIGS. 4A-4I depict an exhaust air duct system 100 that generally includes a computing rack 18 in which one or more network equipment elements 16 may be mounted. In this embodiment, the intake coupling 12 may be mounted adjacent to the hot air exhausting portion 62 of one of the network equipment elements 16 using the adjustable rack coupling mechanism 110. The rack coupling mechanism 110 is adjustable to adapt to varying depths/dimensions of different networking equipment in relation to the positioning of the networking equipment 16 within the rack 18.

Figure 4A:
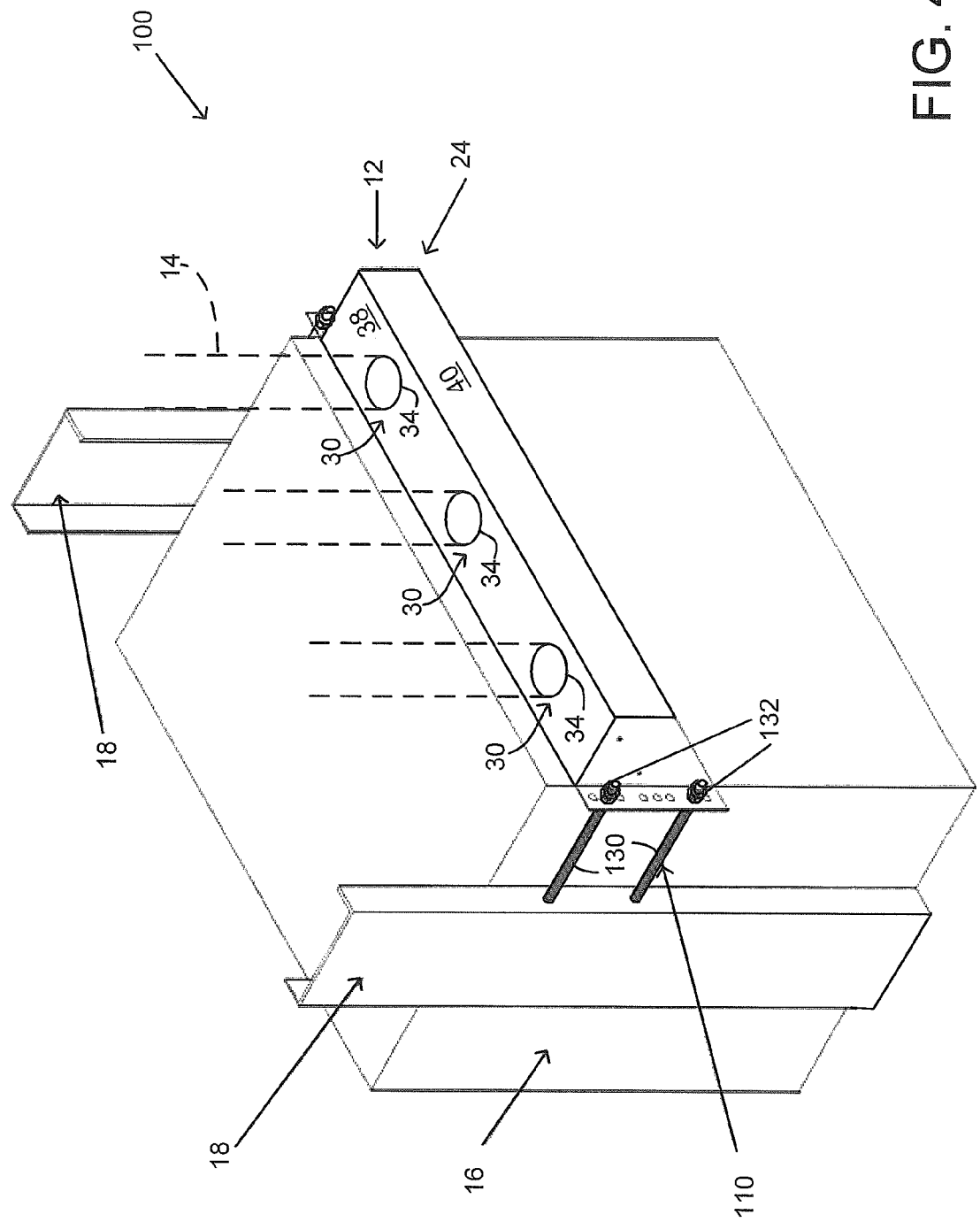
FIG. 4A depicts another embodiment of the exhaust air duct system.
Figure 4B:
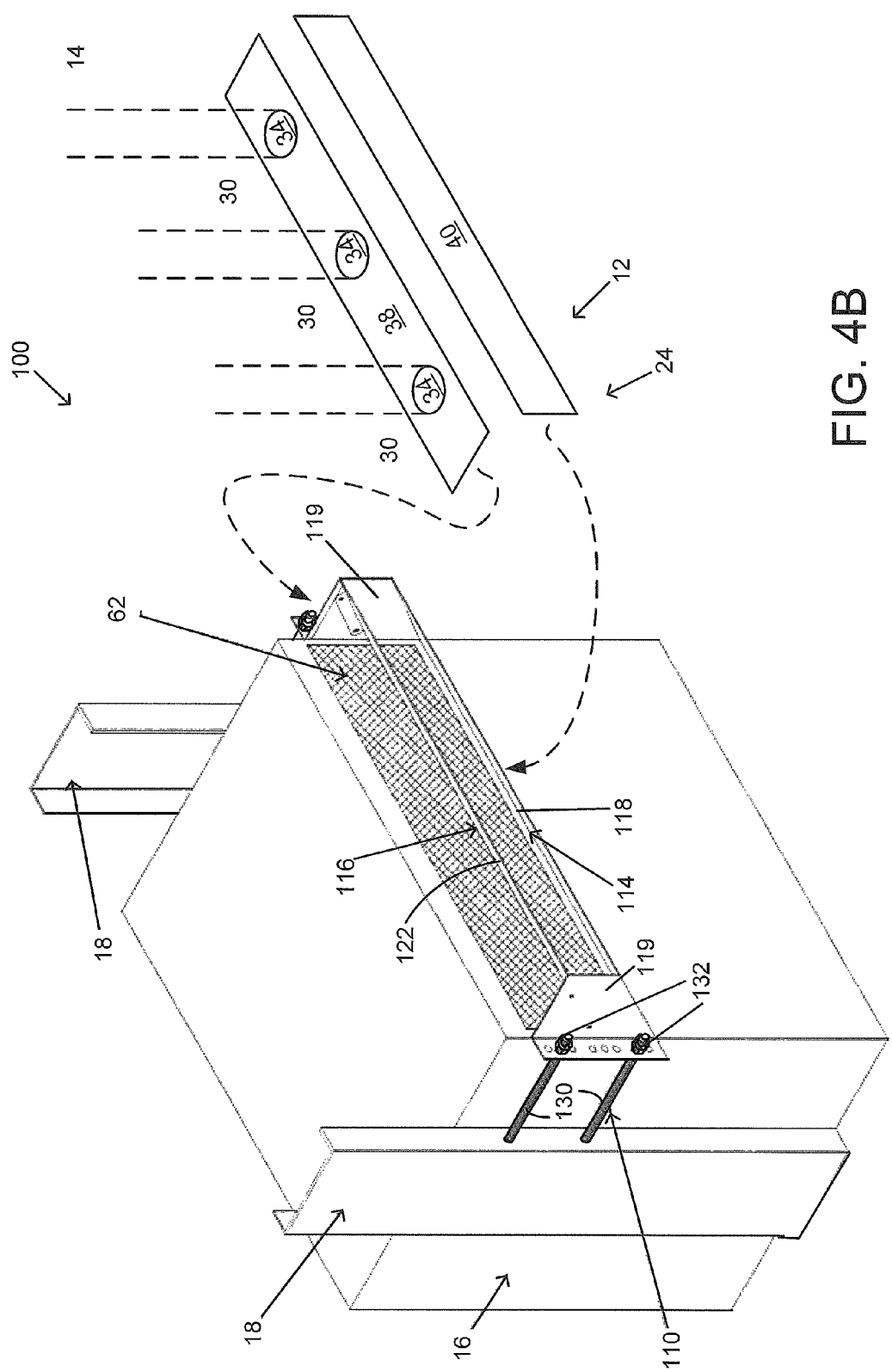
FIG. 4B depicts the exhaust air duct system of FIG. 4A with the top sheet and back sheet removed.

As seen in FIG. 4B, the intake coupling 12 may include an air deflector assembly 24 that includes one or more vanes 118, 122 enclosed by a top sheet 38 and a back sheet 40 of material. The top sheet 38 may include ports 30 that define openings 34 within the top sheet 38 that may be coupled with the ducts 14, as will be described in detail below.

Figure 4D:
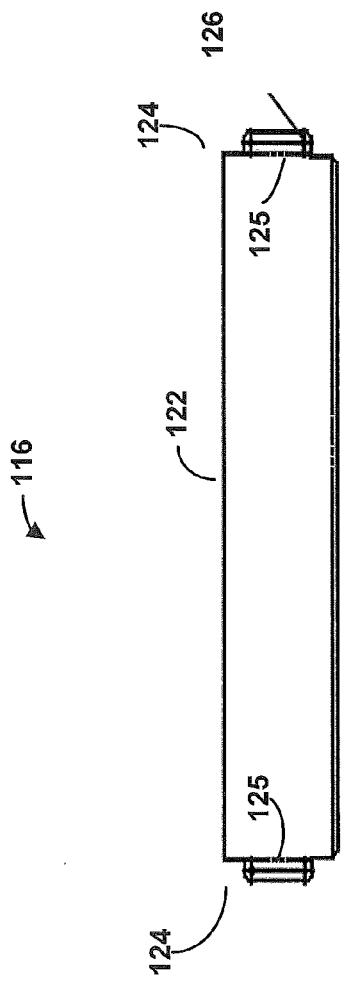
Figure 4C:
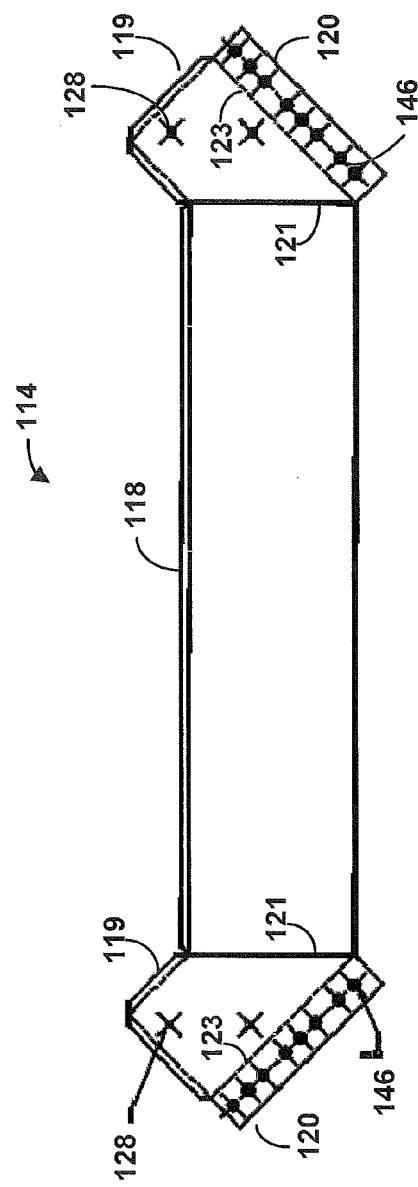

Referring now to FIGS. 4A through 4I, various components of the intake coupling 12 will be described. The air deflector assembly 24 generally includes the top sheet 38 and the back sheet 40 of material that may be cut to a shape as shown in FIG. 4B. The air deflector assembly 24 may include a first sheet of metal 114 cut to a shape as shown in FIG. 4C, and a second sheet of metal 116 cut to a shape as shown in FIG. 4D.

The top sheet 38, the back sheet 40, and the metal sheets 114, 116 as shown can be made of carbon steel having a thickness of approximately 0.10 inches, but any type of material having any suitable thickness may be used. For example, the deflector assembly 24 may be formed from plastic material that is injection molded into its final shape, and sufficiently heat tolerant to work with conventional exhaust air temperatures.

As seen in FIG. 4B, the top sheet 38 and the back sheet 40 may be two separate sheets of material that are coupled together. Alternatively, the sheets 38, 40 may be a single sheet of material that is bent along a bend line. If coupled together, the top sheet 38 may, for example, include a flange (not shown) along a portion of a length of an edge of the top sheet 38 that abuts the back sheet 40. The back sheet 40 may then be coupled to the top sheet 38 at the flange via a rivet, nut/bolt, weld, or otherwise.

Still referring to FIG. 4B, the top sheet 38 may include one or more ports 30 that may be coupled with the duct(s) 14. The one or more ports 30 define openings 34 therein such that the exhaust air from the network equipment element 16 is directed by the vanes 118, 122 towards and through the openings 34 of the ports 30 and into the duct(s) 14. The ports 30 may include flanges (not shown) that extend upward in the direction of the duct 14 such that the duct 14 may be fitted over the flanges and secured to the port 30 by hose clamps, zip ties, wire ties, or other fastening mechanisms. While the embodiment of FIGS. 4A-4B depicts three circular ports 30, the ports 30 may include more or less ports 30 and may include ports 30 of different shapes. For example, the exhaust air duct system 10 may include a single port 30 positioned on an end of the top sheet 38. In this example, the duct 14 may be routed on a side of the rack 18 of network equipment elements 16 such that the back side of the rack 18 is relatively unobstructed by the duct system 100.

Referring now to FIGS. 4C-4D, the first sheet of metal 114 includes a planar and rectangular vane 118 and a pair of planar sidewalls 119 extending on either side of the vane 118 in an angled direction. Extending from a bottom side of the sidewalls 119 are flanges 120 with through holes 146 for coupling and positioning the air deflector assembly 24 to a computer rack 18. As seen in FIG. 4C, bend lines 121 separate the vane 118 and the sidewalls 119 and additional bend lines 123 separate the sidewalls 119 and the flanges 120. When bent to shape along the bend lines 121, 123, the sidewalls 119 cause the vane 118 to be oriented at an angle relative to the two flanges 120. Thus, when the flanges 120 are oriented vertically against the hot air exhaust vent 108 of the network equipment element 16 and generally parallel to the vertically extending rails in a computer rack 18, the vane 118 will be oriented at an ascending angle to divert an airflow emanating from the hot air exhaust vent 108 to a direction upwards from the horizontal direction.

Turning to FIG. 4D, the second sheet of metal 116 includes another rectangular and planar vane 122 having two flange members 124 on either end. Bend lines 125 form at an interface between the flange members 124 and the vane 122. When bent to shape along bend lines 125, the second sheet of metal 116 may be secured to the first sheet of metal 114 using bolts, rivets, or other attachment mechanisms inserted through holes 126 in the second sheet of metal 116 and holes 128 formed in the first sheet of metal 114. In this way, the vanes 118, 122 act to direct the flow of exhaust air upwards and towards the openings 34 of the ports 30, which lead to the ducts 14.

FIGS. 4E-4G illustrate the air deflector assembly 24 after the first sheet of metal 114 and the second sheet of metal 116 are bent to shape and attached to one another. The air deflector assembly 24 may have any size reasonably contemplated to span some or all of a network element 16 and bridge between rack structures 18 to which the deflector 24 is attached. That is, the air deflector assembly 24 my only span a partial width of a rack 18, a full width of a rack 18, or a width of more than one rack 18.

In one aspect and as seen in FIG. 4E, the air deflector assembly 24 has a width Wd such that holes 146 configured in the flanges 120 have a similar distance to that of a conventional computing rack, such as a 19 inch computing rack or a 23 inch computing rack. More specifically, the distance Wd may be approximately the same as the width between opposing side rails of a computer rack 18, where a network element 16 or other form of computing equipment fits between the side rails. Additionally and as seen in FIG. 4F, the air deflector assembly 24 may include a height Hd of approximately 6.0 inches and a depth Dd, as seen in FIG. 4G, of approximately 4.0 inches; nevertheless, any suitable dimensions may be used that deflects the airflow at a desired level.

Figure 4I:
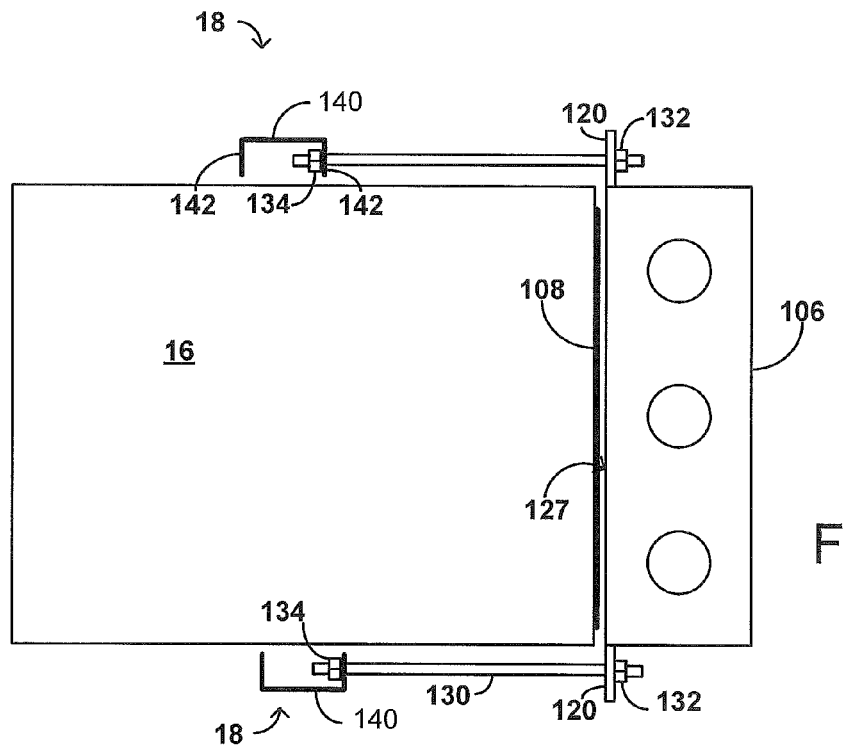
FIGS. 4H-4I depict side and top views of the exhaust air duct system of FIG. 4A.
Figure 4H:
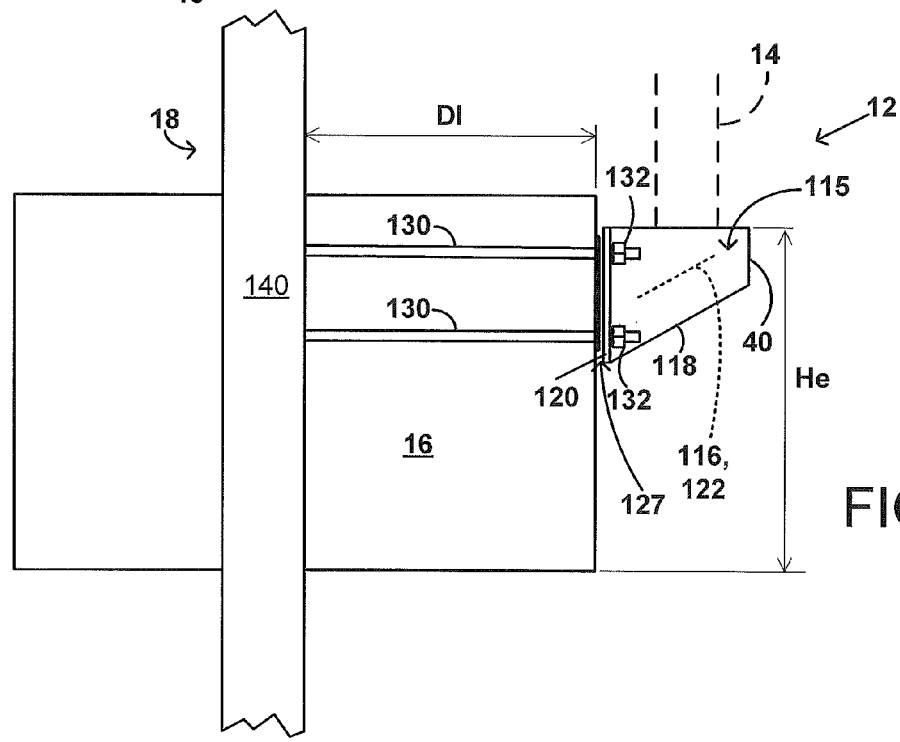

As seen in FIG. 4H, which is a side view of a computing rack 18 having a network equipment element 16 on which the example intake coupling 12 is mounted, the second sheet of metal 116 may be sized so that there is a gap 115 between an outer edge of the vane 122 and the back sheet 40 of material. The gap 115 enables airflow from underneath the vane 122 to divert around the vane 122 and into the above ducting 14. In this manner, two vanes 118 and 122 may be provided for upwardly deflecting warm air exhaust airflow from a network equipment element 16 into an above duct 14.

Although the particular embodiment describes the use of two vanes for deflecting an airflow, other numbers of vanes may be used, such as only one vane or three or more vanes. Additionally, although the present embodiment describes vanes configured to deflect an exhaust airflow that is exhausted in a substantially horizontal direction to an upward direction, it is contemplated that other embodiments may be configured to deflect an airflow having any initial direction to another direction that is different from the initial direction. For example, the air deflector 24 may be configured to deflect a horizontal airflow to a downward direction.

When each of the first and second sheet of metal 114 and 116 are bent to shape and attached to one another, a multi-vane air deflector is formed for diverting an airflow from a hot air exhaust vent of a network equipment element configured in a computing rack. When the top sheet 38 and the back sheet 40 couple with the first and second sheet of metal 114 and 116, an enclosed intake coupling 12 is formed for directing the airflow through the openings 34 of the ports 30 and into the above ducting 14. In this embodiment and as seen in FIGS. 4B and 4H, the vanes 118, 122 are substantially parallel to one another and are oriented at approximately a 45 degree angle relative to the flanges 120, although any suitable angular orientation may be used that causes the airflow to be diverted in a desired direction. For example, the vanes 118, 122 may be at an angle of about 30 degrees relative to the flanges 120, about 35 degrees relative to the flanges 120, about 40 degrees relative to the flanges 120, about 50 degrees relative to the flanges, or about 55 degrees relative to the flanges, among others. In this and other embodiments, substantially parallel may be exactly parallel or offset from parallel by about 1 degree, 2 degrees, 3 degrees, 4 degrees, or otherwise. Multiple vanes may provide an advantage in that a more laminar diversion of air flow may be obtained than would otherwise be provided by a single vane design that could potentially cause turbulent airflow that may, in turn, cause undue backpressure to the hot air exhaust vent and/or stagnant exhaust air proximate the network equipment element.

Continuing with the air deflector 24, reference is made to FIGS. 4H-4I depict a side view and top view, respectively, of the computing rack 18 having a network equipment element 16 and the intake coupling 12 is mounted thereon. As shown in this particular embodiment, the rack coupling mechanism 110 comprises two pair of bolts 130 onto which nuts 132 may be screwed for securing the exhaust air deflector 106 to the rack 18 in a close proximity to the back portion of the network equipment element 16. In certain embodiments, the intake coupling 12 may be positioned with a gap 127 of about 1 inch between the intake coupling 12 and the network equipment element 16. The gap allows for air to bypass or flow around the system 100 if, for example, the system 100 experiences backpressure.

The bolts 130, as shown, may include an elongated section of metal rod that is threaded along its entire extent. Rods such as these are often referred to as 'all-thread'. Nevertheless other embodiments contemplate that that bolts 130 may have threaded sections that extend only along a portion of their extent. The threaded sections of the bolts allow the nuts 132 to be selectively screwed toward, or away, from the rack 102 such that the intake coupling 12 may be mounted against a network equipment element 16, which may project any lateral distance DI from the computing rack 18. Stated differently, the elongate threaded bolt 130 allows the air deflector 24 to be mounted adjacent the exhaust air side of a piece of computing equipment 16 when the degree to which the equipment 16 extends away from the side rails may vary relative to other equipment 16. Thus, the use of the rack coupling mechanism 110 described herein enables the gap 127 between the equipment 16 and the air deflector 24 to be adjusted to increase or decrease the size of the gap 127 to facilitate a desirable airflow through the air deflector 24 while minimizing back pressure.

Although the particular embodiment shown in the figures uses threaded bolts 130, other embodiments may include any type of structure that provides a tension force between the intake coupling 12 and the rack 18 at varying lateral distances DI that may be encountered by the intake coupling 12 configured in the rack 18. For example, an intake coupling 12 may include on or more spacers that may selectively added to, or removed to provide a desired lateral distance for mounting the intake coupling 12 to the network equipment element 16. As another example, the intake coupling 12 may include one or more tension springs that physically couple the rack 18 to the intake coupling 12 in a manner that exerts a tension force upon the intake coupling 12 for maintaining the intake coupling 12 adjacent to the network equipment element 16.

Referring to FIGS. 4H-4I, the rack 18 as shown includes two elongated sections of U-shaped rails 140 having flange portions 142 configured with multiple holes along their extent for attachment of multiple network equipment elements 16 on top of one another in the rack 18. The bolts 130 may each be secured to the rack 18 by inserting the bolts into these one of these holes and secured using nuts 134 screwed onto the bolts 130.

Nevertheless, certain scenarios may arise in which the holes configured in the rails are not in locations that are optimally suitable for mounting the intake coupling precisely over the hot air exhaust vent of the network equipment element 16. Accordingly, the flange 120 of the exhaust air deflector 106 is provided with a number of equally-spaced holes 146 into which the bolts may be inserted to provide a desired elevational height He, as seen in FIG. 4H, of the intake coupling 12 relative to that of the network equipment element 16 when mounted in the rack 18.

To use, it may be ascertained that a network equipment element 16 configured in a computing rack 18 with one or more other network equipment elements 16 emits a horizontal airflow that could be improved if the airflow were deflected in an upward direction. The network equipment element 16 has an air outlet 108 configured at any distance from the rails 18 of the computing rack 16. The user may then select one or more unused holes along the extent of the flange portions 142 of the rack 16 and insert the threaded bolts through these holes and apply nuts 134 to the back side of the rails 140. Next, the user may select certain holes 146 in the flange 120 of the intake coupling for insertion of the threaded bolts 130 such that the intake coupling is properly elevationally aligned with the air outlet 108 of the network equipment element 16. Once inserted nuts 132 may be screwed onto the bolts 130 and tightened to ensure that the intake coupling remains in proper position relative to the air outlet 108 of the network equipment element 16.

Figure 5:
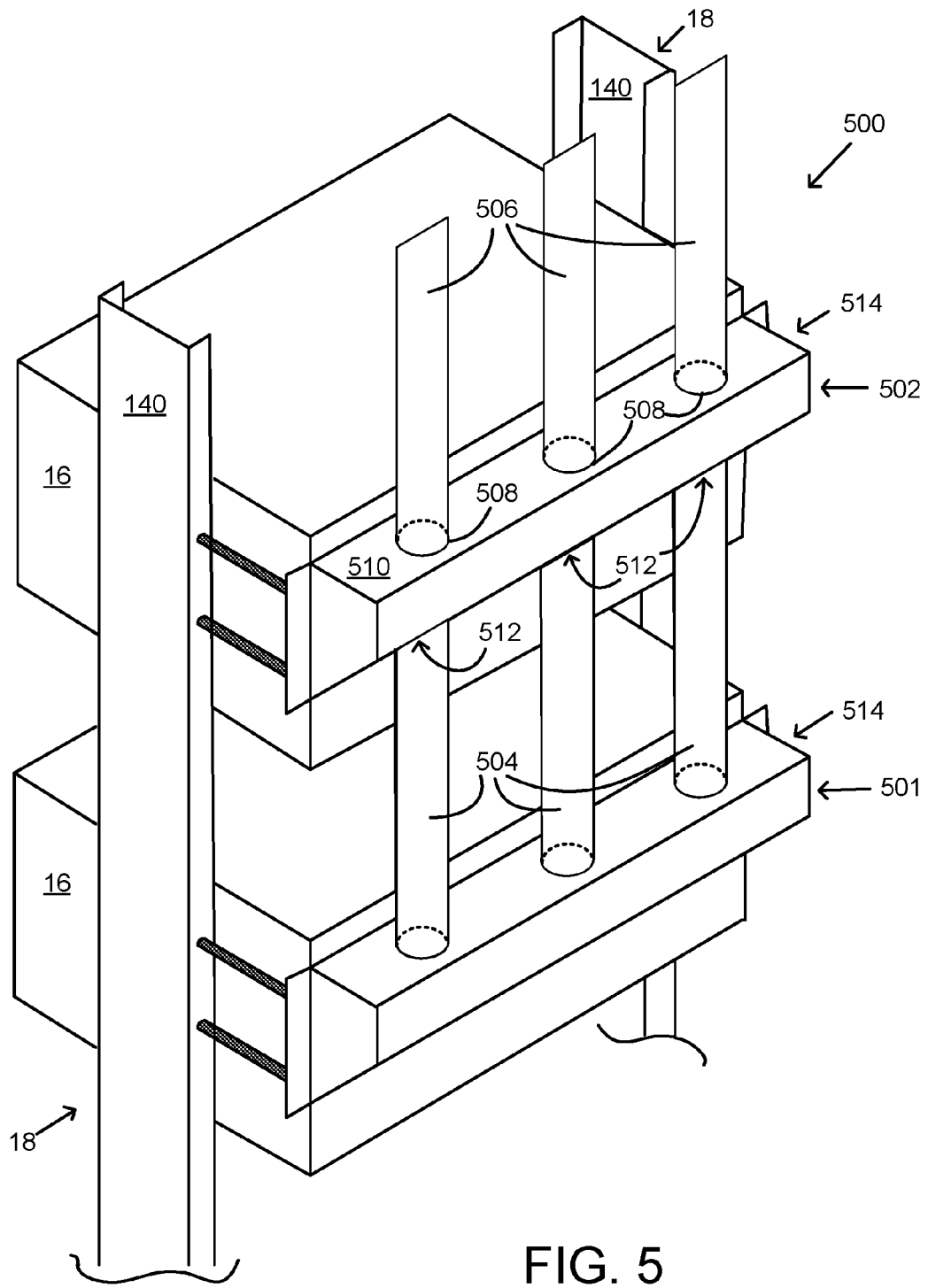
FIG. 5 depicts an exhaust air duct system with two sets of intake couplings and ducts.

Turning to uses of the system with multiple pieces of network equipment 16, FIG. 5 depicts an exhaust air ducting system 500 that is similar to the system of FIG. 4, except that it is configured to exhaust hot air from multiple network equipment elements 16 within a rack 18. More particularly, the air ducting system 500 includes a first and second intake coupling 501, 502 and a set of ducts 504, 506 extending upwards from each intake coupling 501, 502. While the air ducting system 500 of FIG. 5 is similar to the embodiment of FIG. 4, the system 500 may be modified when there are multiple network equipment elements 16 within the rack 18. For example, the exhaust air ducting system 500 may be modified such that the ducting 504 associated with the first intake coupling 501 extends upward and terminates in the second intake coupling 502. The air from the first intake coupling 501, thus, mixes with the air in the second intake coupling 502, and all of the air is exhausted through openings in the ports 508 on the top sheet 510 of the second intake coupling 502. The second intake coupling 502 may include intake ports 512 that define openings therein on a bottom side (i.e., vane of first sheet of material) of the air deflector assembly 514. As similarly described with respect to the ports on the intake coupling 10 of FIG. 4, the ports 512 may be affixed to the ducts 504 via flanges on the bottom side of the air deflector assembly 514.

While the ducts 504, 506 are depicted as similarly sized in FIG. 5, the ducts 504, 506 may increase in size (e.g., diameter) as subsequent air intake couplings 12 are added to the system. Stated differently, in order to compensate for an increase in the amount of air flowing through the system from a bottom-most intake coupling to a top-most intake coupling, the diameter of ducts may increase accordingly with each subsequent (i.e., more upwardly positioned) intake coupling.

Figure 6:
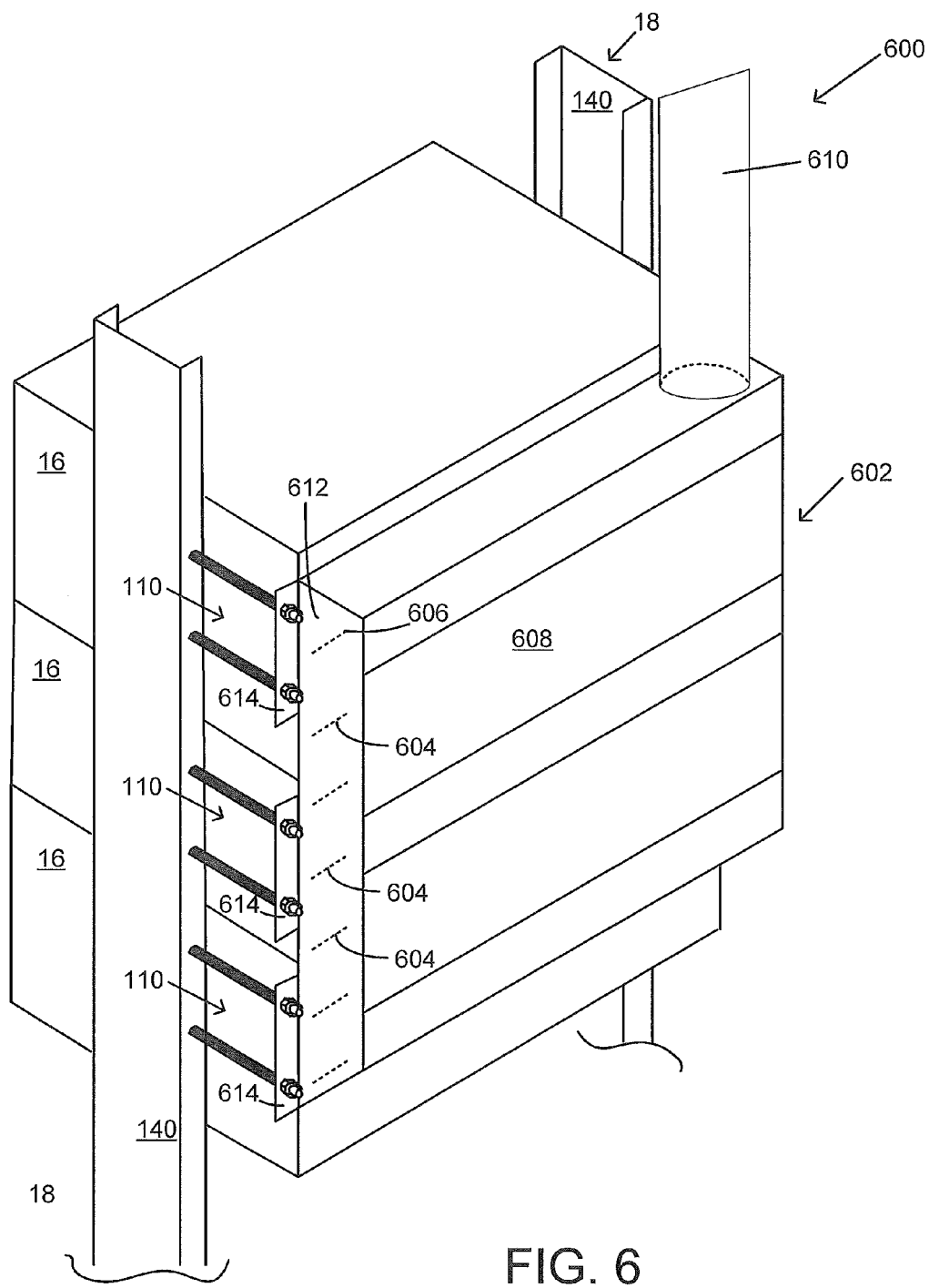
FIG. 6 depicts an exhaust air duct system with modified intake couplings.

FIG. 6 depicts an exhaust air ducting system 600 where the ducts between each network equipment element 16 are formed within the intake coupling 602. The intake coupling 602 may be generally the same as described in reference to FIGS. 4 and 5, except that the intake coupling 602 is elongated, stretched, or continuously extending over the back portion of the equipment 16. The intake coupling 602 may include multiple vanes 604 (i.e., similar to the second vane 122 of the second sheet of material 116 of FIG. 4) that span a height of the intake coupling 602. More particularly, the sidewalls 612 and the back sheet 608 of the intake coupling 602 extend a height that corresponds to multiple pieces of network equipment 16. Each of the multiple vanes 604 may be similar to the vane 122 of the second sheet of metal 116 of the FIG. 4 embodiment. The flanges 614 can extend the entire height of the intake coupling 602, or the flanges 614 can extend from the sidewalls 612 intermittently, as shown in FIG. 6. As far as facilitating airflow within the intake coupling, the vanes 604 may leave a gap between a back edge 606 of the vane 604 and the back sheet 608 of the intake coupling 602 such that once air is diverted by the vanes 604 upward and towards the back sheet 608 of the coupling 602, the air will rise to the top of the intake coupling 602 and exhaust out of the port(s) 610.

Figure 7:
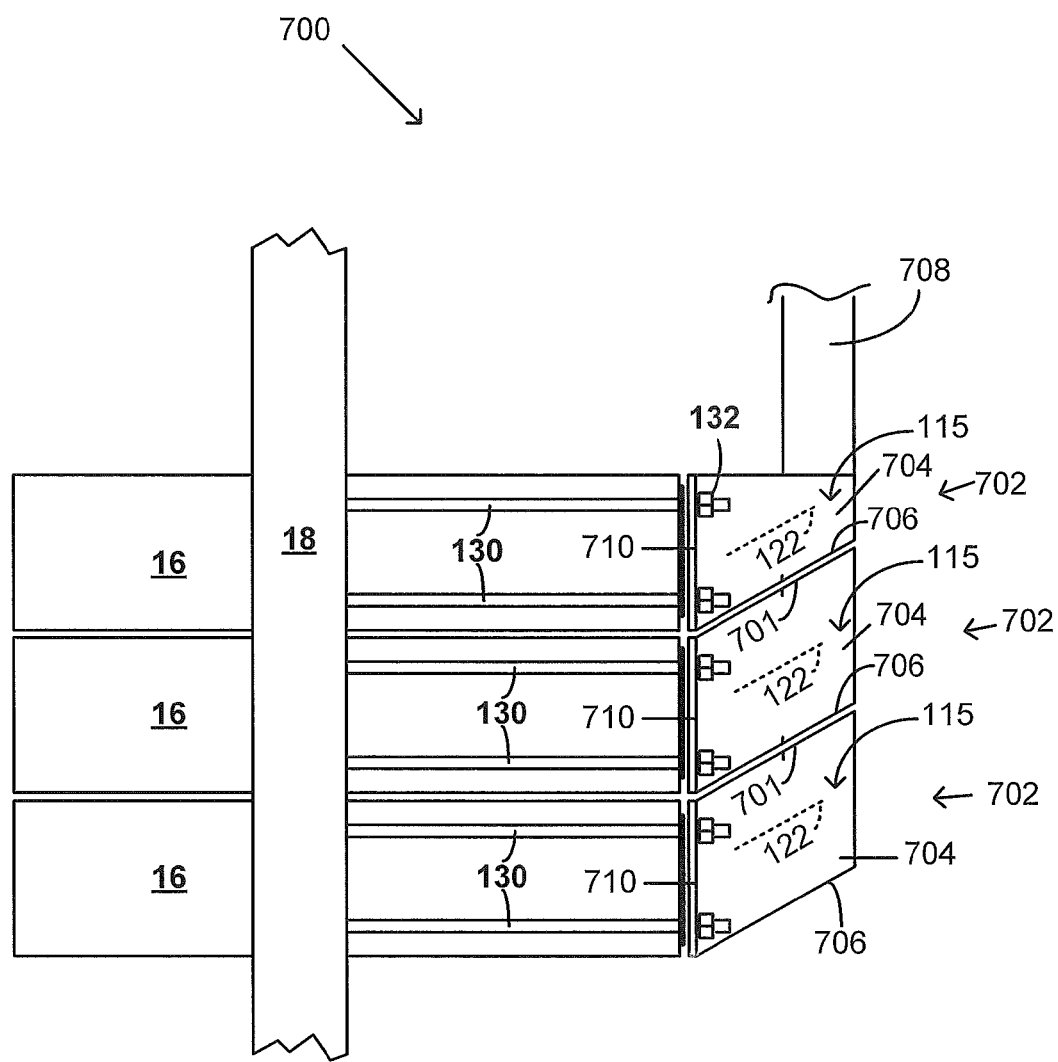
FIG. 7 depicts a side view of an exhaust air duct system with stacked intake couplings.

Instead of a single, continuously vertically extending intake coupling 602, the air ducting system may include the intake couplings of the embodiments of FIGS. 4 and 5 with modifications such that the couplings may be stacked to form intake couplings of a range of sizes. Referring to FIG. 7, which is a side view of a rack 18 coupled with the multiple intake couplings 702 and multiple pieces of network equipment 16, the ducting system 700 may include stackable intake couplings 702 that further include a modified top sheet 701 of material on the top side of the intake coupling 702 and a modified vane 706 on the bottom side of the intake coupling 702. Additionally, the shape of the sidewalls 704 can be modified to be a trapezoidal shape, or any other shape that facilitates uniform stacking of the intake couplings 702. As seen in FIG. 7, the top most intake coupling is similar to the embodiment of FIGS. 4-5. The middle and bottom most intake couplings 702, however, include a trapezoidal sidewall 704 shape such that the top edge of the bottom most intake coupling 702, for example, matches a bottom edge of middle intake coupling 702. While the middle intake coupling 702 will include a modified top sheet 701 and a modified first vane 706 on the bottom side, intake couplings 702 at the top and bottom of the respective stack of intake couplings 702 do not require such modifications. For example, the top most intake coupling 702 only requires a modification to the first vane 706, and the bottom most intake coupling 702 only requires a modification to the top sheet 701. The unmodified top sheet 701 of the top most intake coupling 702 and the unmodified vane 706 of the bottom most intake coupling 702 facilitate enclosing the stack of intake couplings 702 such that air is directed upwards an into an exhaust port 708.

To facilitate the flow of air up the intake coupling 702, the vanes 706 of the middle and top most intake coupling 702 may be modified to include cutouts or slots to allow air to pass vertically through and into the respective intake coupling 702. Similarly, the top sheet 701 of the bottom most and middle intake coupling 702 may be modified by including corresponding cutouts or slots that are generally coextensive with the cutouts or slots in the vanes 706 of adjacent intake couplings 702. This may be also accomplished by providing the top sheet 38 of FIGS. 4-5 with circular ports 30 and modifying the vane 706 to include intake ports on a bottom side of the intake couplings 702 that are generally coextensive, when stacked, with the exhaust ports 30 on the top side of the coupling 702.

Other aspects of the ducting system 700 may be incorporated from other embodiments without departing from the scope of the present disclosure. For example, the ducting system 700 may include the rack coupling mechanism 110 of previous embodiments. Additionally, the ducting system 700 may include another vane 122 that provides a gap 115, as described in reference to FIGS. 4-5.

As stated above, in order to stack the intake couplings 702, the top of the sidewalls 704 may be cut or reduced so that it matches the angle (e.g., 45 degrees) of the bottom of the sidewall 704 relative to the flange 710. In this way, the bottom surface of the intake couplings 702 evenly stack on top of the top surface of a vertically adjacent intake coupling 702. As seen in FIG. 7, the shape of the sidewalls 704 are trapezoidal, however, other shapes are contemplated and within the scope of the disclosure.

Although various representative embodiments have been described above with a certain degree of particularity, those skilled in the art could make numerous alterations to the disclosed embodiments without departing from the spirit or scope of the inventive subject matter set forth in the specification. All directional references (e.g., top, bottom) are only used for identification purposes to aid the reader's understanding of the various embodiments of the present disclosure, and do not create limitations, particularly as to the position, orientation, or use of the embodiments unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In methodologies directly or indirectly set forth herein, various steps and operations are described in one possible order of operation, but those skilled in the art will recognize that steps and operations may be rearranged, replaced, or eliminated without necessarily departing from the spirit and scope of the present disclosure. It is intended that all matter contained in the above description or shown in the accompanying drawings shall be interpreted as illustrative only and not limiting. Changes in detail or structure may be made without departing from the spirit of the disclosure as defined in the appended claims.

What is claimed is:

1. An apparatus for thermally managing network equipment, the apparatus comprising:
   an intake coupling comprising one or more vanes and an exhaust port, the intake coupling configured to be positioned adjacent a hot air exhaust vent of a network equipment element and configured to: receive an airflow from the hot air exhaust vent at a first direction; deflect the airflow in a second direction via the one or more vanes; and exhaust the airflow through an opening in the exhaust port;
   a duct comprising a first end, a second end, and an airflow passage extending between the first end and the second end, the first end coupled to the exhaust port of the intake coupling and the second end configured to be positioned above the network equipment element, the airflow passage configured to direct the airflow from the first end to the second end; and
   a rack coupling mechanism operably couplable to a rack and configured to adjustably position the intake coupling relative to the rack, the rack coupling mechanism comprises a plurality of elongated bolts that supports the intake coupling in a position relative to the hot air exhaust vent of the network equipment element using a pair of flanges each configured to couple on opposing sides of the intake coupling.

2. The apparatus of claim 1, wherein adjustment of the plurality of elongated bolts changes the position by increasing or decreasing a lateral distance between the intake coupling and the hot air exhaust vent.

3. The apparatus of claim 1, wherein each of the pair of flanges comprises a plurality of holes into which one of the plurality of elongated bolts is configured to be inserted according to a desired height of the intake coupling relative to a height of the hot air exhaust vent.

4. The apparatus of claim 1, further comprising the rack housing the network equipment element, and wherein the rack comprises a pair of opposing vertically oriented U-shaped rails configured with multiple holes, the network equipment element positioned between the rails and the multiple holes of the rails being spaced relative to a height of the network equipment element, a first bolt of the plurality of elongated bolts secured in one of the multiple holes of a first rail of the pair of rails and a second bolt of the plurality of elongated bolts secured in one of the multiple holes of a second rail of the pair of rails, each of the first bolt and the second bolt secured in one of a plurality of spaced apart holes in a respective one of a pair of flanges configured on opposing sides of the intake coupling such that the intake coupling is adjustably positioned at a height sufficient to cover the hot air exhaust vent.

5. The apparatus of claim 1, wherein the intake coupling is formed from a first planar sheet of metal that, when bent to its final shape, forms at least one vane of the one or more vanes.

6. The apparatus of claim 5, wherein the one or more vanes comprises a second vane formed from a second planar sheet of metal.

7. The apparatus of claim 1, wherein the first direction is a horizontal direction and the second direction is upward of the horizontal direction.

* * * * *